United States Patent [19]
Bryant et al.

[11] Patent Number: 6,100,564
[45] Date of Patent: Aug. 8, 2000

[54] SOI PASS-GATE DISTURB SOLUTION

[75] Inventors: Andres Bryant; Edward J. Nowak; Minh H. Tong, all of Essex Junction, Vt.

[73] Assignee: International Business Machines Corporation, Armonk, N.Y.

[21] Appl. No.: 09/163,950

[22] Filed: Sep. 30, 1998

[51] Int. Cl.⁷ .............................. H01L 27/01; H01L 29/10
[52] U.S. Cl. ........................... 257/347; 257/349; 257/354
[58] Field of Search .................................... 257/347, 354, 257/349

[56] References Cited

U.S. PATENT DOCUMENTS

| | | |
|---|---|---|
| 4,044,373 | 8/1977 | Nomiya et al. . |
| 4,586,064 | 4/1986 | Esser et al. . |
| 4,710,791 | 12/1987 | Shirato et al. . |
| 4,893,158 | 1/1990 | Mihara et al. . |
| 4,907,053 | 3/1990 | Ohmi . |
| 5,160,989 | 11/1992 | Houston . |
| 5,293,058 | 3/1994 | Tsividis . |
| 5,317,181 | 5/1994 | Tyson . |
| 5,489,792 | 2/1996 | Hu et al. . |
| 5,498,882 | 3/1996 | Houston . |

*Primary Examiner*—Stephen D. Meier
*Attorney, Agent, or Firm*—Scully, Scott, Murphy & Presser; Eugene I. Shkurko, Esq.

[57] ABSTRACT

An SOI pass-gate disturb solution for an N-type MOSFET wherein a resistor is connected between the gate and the body of the FET to eliminate the disturb condition. The FET is fabricated in a substrate having a source, a drain and a gate, wherein the body of the field effect transistor is electrically floating and the transistor is substantially electrically isolated from the substrate. A high resistance path is provided coupling the electrically floating body of the FET to the gate, such that the body discharges to a low state before significant thermal charging can occur when the gate is low, and thus prevents the accumulation of a charge on the body when the transistor is off. The resistance of the high resistance path is preferably approximately $10^{10}$ Ohms-um divided by the width of the pass-gate.

5 Claims, 5 Drawing Sheets

SOI PASS-GATE DISTURB SOLUTION

BACKGROUND OF THE INVENTION

1. Field of the Invention

The present invention relates generally to a Silicon On Insulator (SOI) pass-gate disturb solution, and more particularly pertains to an SOI pass-gate disturb solution for an N-type Metal Oxide Semiconductor Field Effect Transistor (MOSFET) wherein a resistor is connected between the gate and the body if the MOSFET to eliminate the disturb condition.

2. Description of Prior Art

N-type MOSFETs are used as pass-gates in Complementary Metal Oxide Semiconductor (CMOS) circuits for improved density and performance. In the SOI, the body or the substrate of the FET electrically floats. This floating leads to a disturb problem when the source and the drain electrodes are held high for greater than the thermal generation time and the gate is held low, followed by a transition from high to low by the input, which is usually the source. Holes generated in the body prior to the transition are drawn into the source by the low potential during the transition. The bipolar gain, with the source acting as the emitter, the body as the base, and the drain as the collector, results in a current pulse at the output of the pass-gate, which is usually the drain, given by the NPN beta times the body discharge current formula (Cgate×Vdd/Tfall). This current pulse can cause the circuit, which is to be isolated by the pass-gate, to falsely make a transition to the low state.

The current approach to solving this problem is to either increase the noise tolerance of the circuit being isolated by the pass-gate, and/or to add processing steps to reduce the NPN parasitic bipolar gain.

Increasing the immunity of the isolated circuit, called the latch, to this current pulse compromises performance as more current is now required from the pass-gate to complete a desired transition to the low state. Reduction of the NPN gain requires introduction of additional processing steps which involve compromises in leakage and manufacturing heat cycles.

SUMMARY OF THE INVENTION

Accordingly, it is a primary object of the present invention to provide an SOI pass-gate disturb solution.

A further object of the subject invention is the provision of an SOI pass-gate disturb solution for an N-type MOSFET wherein a resistor is connected between the gate and the body of the MOSFET to eliminate the disturb condition.

The present invention eliminates the disturb condition by adding a resistor whose value is approximately $10^{10}$ Ohms-um divided by the width of the pass-gate between the gate and the body of the pass-gate. At this value of resistance, the body will always discharge to the low state before significant thermal charging can occur when the gate is low, and thus prevent accumulation or build up of the body charge when the pass-gate is off. The value of the resistor is high enough such that the current from the gate to the body, when the gate is high and the source and drain are low, is negligible compared to the MOSFET subthreshold current. This circuit also significantly lessens the increase in standby current in SOI MOSFETs since the low gate potential grounds the body and keeps the threshold voltage (Vt) from dropping due to drain avalanche current charging of the body.

In accordance with the teachings herein, the present invention provides a field effect transistor and a method of fabricating in a substrate, and having a source, a drain and a gate, wherein the body of the field effect transistor is electrically floating and the transistor is substantially electrically isolated from the substrate. Pursuant to the present invention a high resistance path is provided coupling the electrically floating body of the field effect transistor to the gate of the field effect transistor. During operation, the high resistance path discharges the body to a low state before significant thermal charging can occur when the gate is low, and thus prevents the accumulation of a charge on the body when the transistor is off.

In greater detail, the resistance of the high resistance path is approximately $10^{10}$ Ohms-um divided by the width of the pass-gate. The high resistance path is sufficiently high such that current from the gate to the body, when the gate is high and the source and drain are low, is negligible compared to the subthreshold current.

The transistor is preferably fabricated in SOI MOSFET, and the circuit significantly lessens an increase in standby current in the SOI MOSFET since the resultant low gate potential grounds the body and prevents the threshold voltage (Vt) from dropping due to drain avalanche multiplication of the current charging the body.

BRIEF DESCRIPTION OF DRAWINGS

The foregoing objects and advantages of the present invention for an SOI pass-gate disturb solution may be more readily understood by one skilled in the art with reference being had to the following detailed description of a preferred embodiment thereof, taken in conjunction with the accompanying drawings wherein like elements are designated by identical reference numerals throughout the several views, and in which.

DETAILED DESCRIPTION OF THE INVENTION

Figure 1:
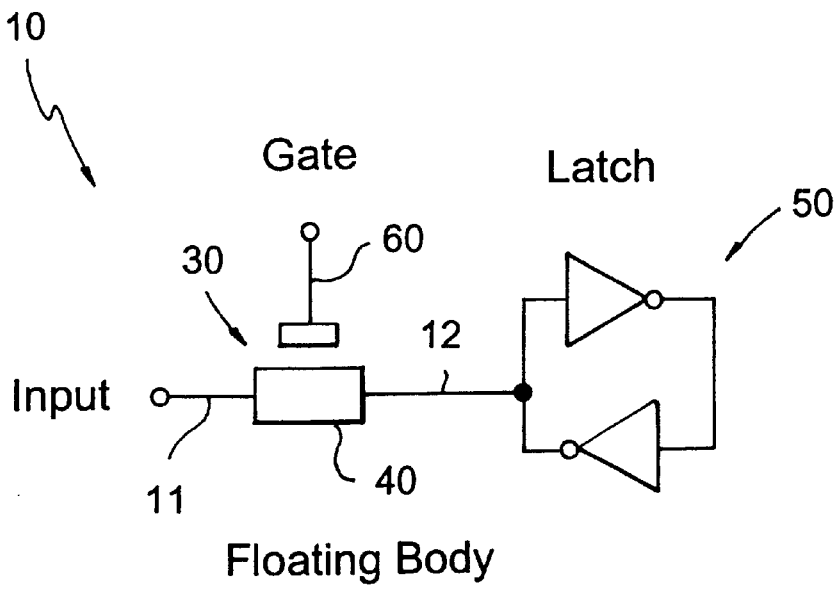
FIG. 1 is a schematic illustration of a typical prior art N-type MOSFET which is used as a pass-gate in a CMOS circuit.
Figure 3:
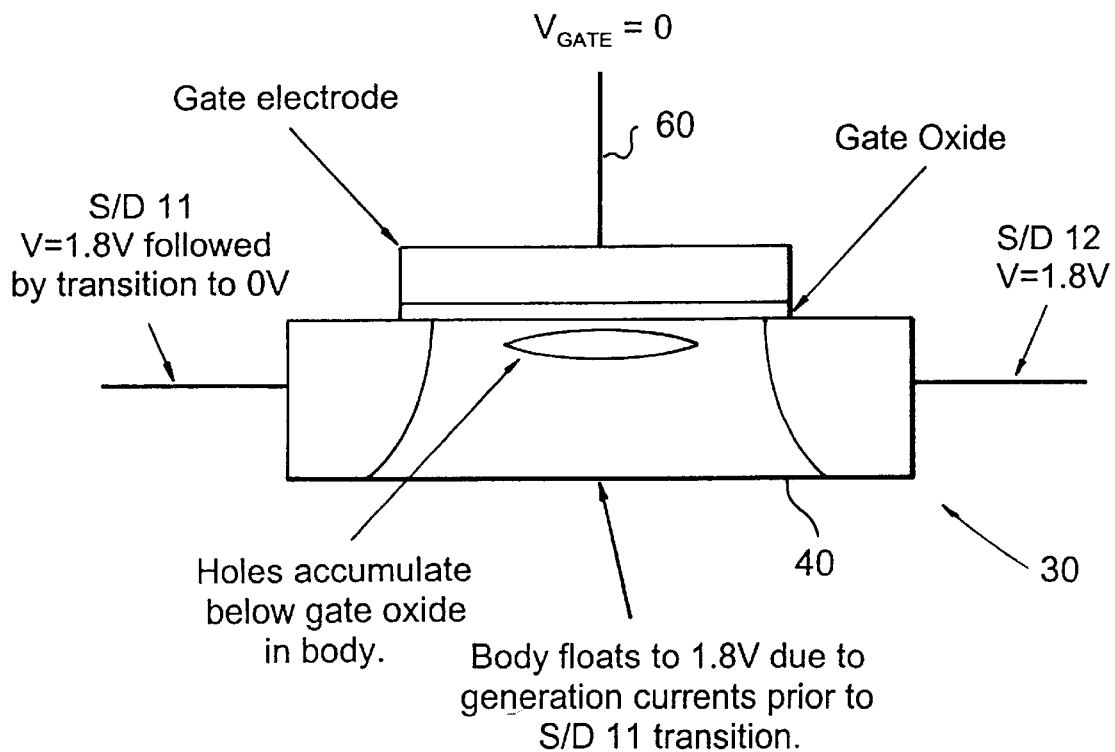
FIG. 3 is an illustration of an FET, in which the body or the substrate electrically floats.

Referring to the drawings in detail, FIG. 1 illustrates a typical N-type MOSFET SOI circuit 10 which is used as a pass-gate in a CMOS circuit. The N-type MOSFET SOI circuit 10 comprises a MOSFET 30 having a first source/drain 11 and a second source/drain 12, and is controlled by a gate 60. In this type of circuit, the body or substrate of the FET electrically floats as shown in FIG. 3, leading to a disturb problem when the source and drain electrodes 11, 12 are held high, i.e., 1,8 volts, for greater than the thermal generation time of 100 microseconds and the gate 60 is held low, i.e., 0 volts, followed by a transition from high to low by the input source 11. Holes generated in the body 40 prior to the transition are drawn into the source 11 by the low potential during the transition. With the source 11 acting as the emitter, the body 40 as the base, and the drain 12 as the collector, this movement of holes results in a current pulse at the drain 12, the output of the pass-gate given by the NPN beta times the body 40 discharge current represented by (Cgate×Vdd/Tfall). This current pulse can cause the latch circuit 50, which is to be isolated by the pass-gate, under circumstances as described above, to falsely make a transition to the low state of, e.g., 0 volts.

Figure 2:
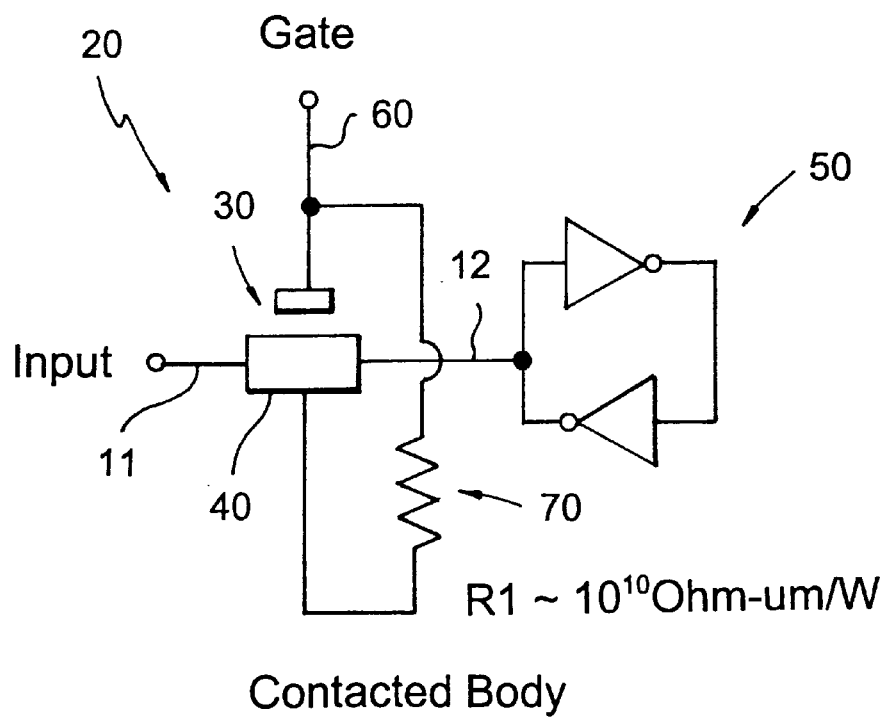
FIG. 2 is a schematic illustration of an exemplary embodiment of an N-MOSFET pass-gate circuit pursuant to the present invention wherein a resistor has been added between the gate and the body or substrate of the transistor.

FIG. 2 shows an exemplary embodiment of a N-type MOSFET pass-gate circuit 20 pursuant to the present invention wherein a resistor 70, is connected between the gate 60 and the body 40 of the transistor 30 to eliminate the disturb condition. The resistor 70 typically consists of a lightly-doped, e.g., ~10,000 Ohm-cm, narrow, e.g., ~0.25 um, polysilicon line.

Figure 4A:
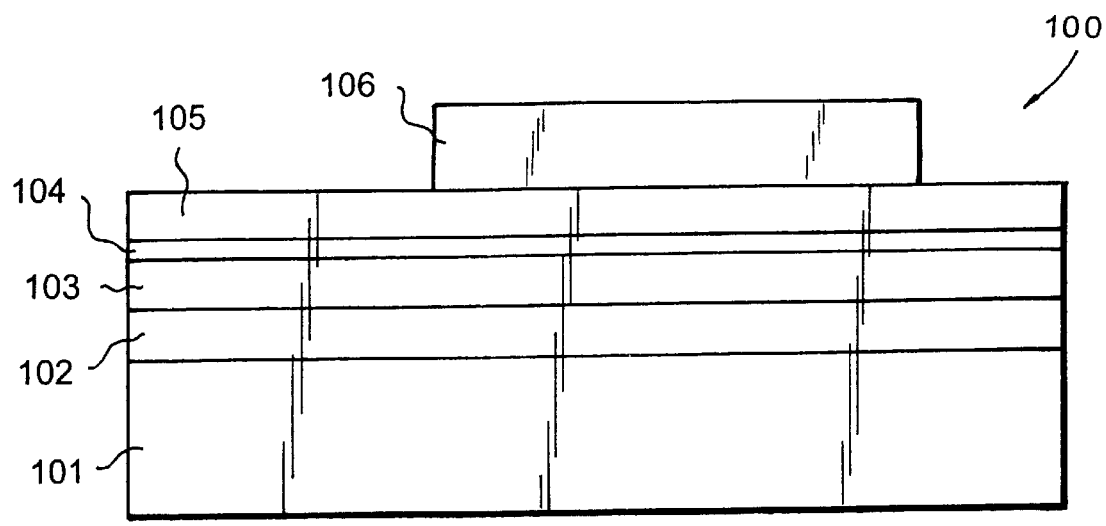
FIG. 4 is a sequence of steps a) through f) for forming the transistor of an exemplary embodiment having a resistor connected between the gate and the body of the transistor.
Figure 4B:
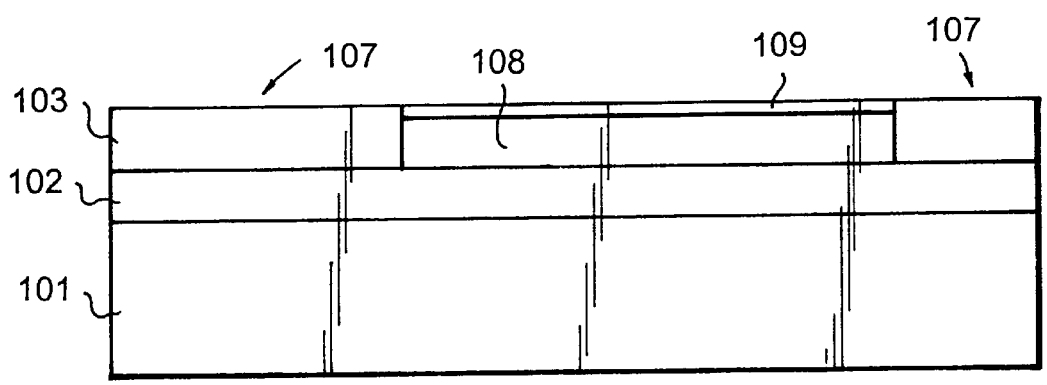
Figure 4C:
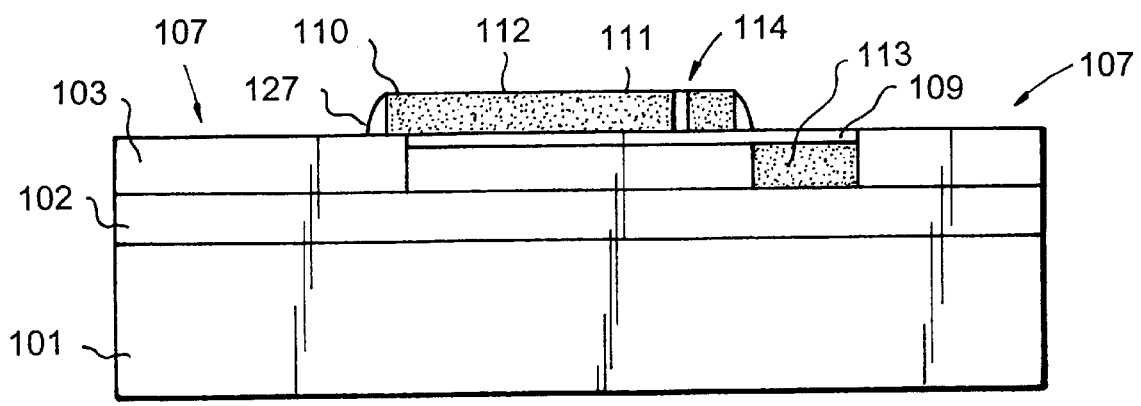
Figure 4D:
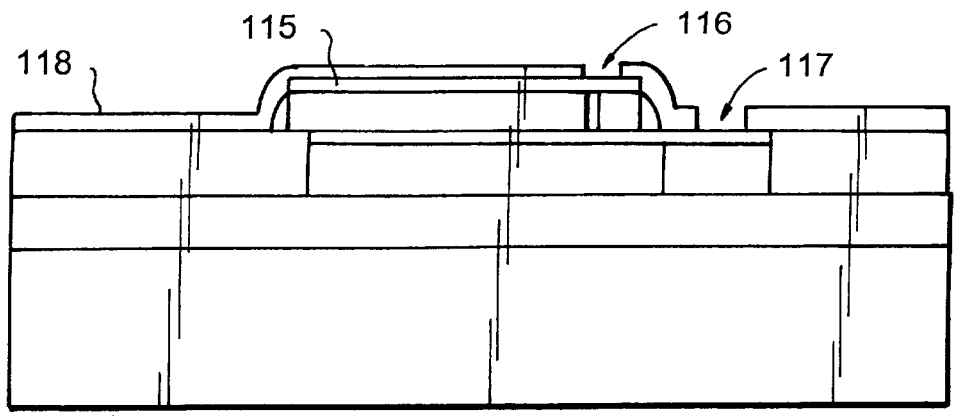
Figure 4E:
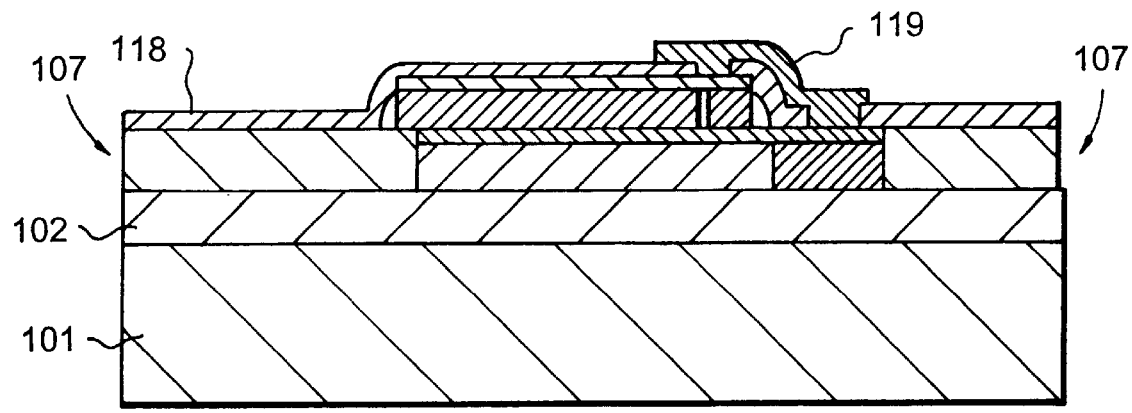
Figure 4F:
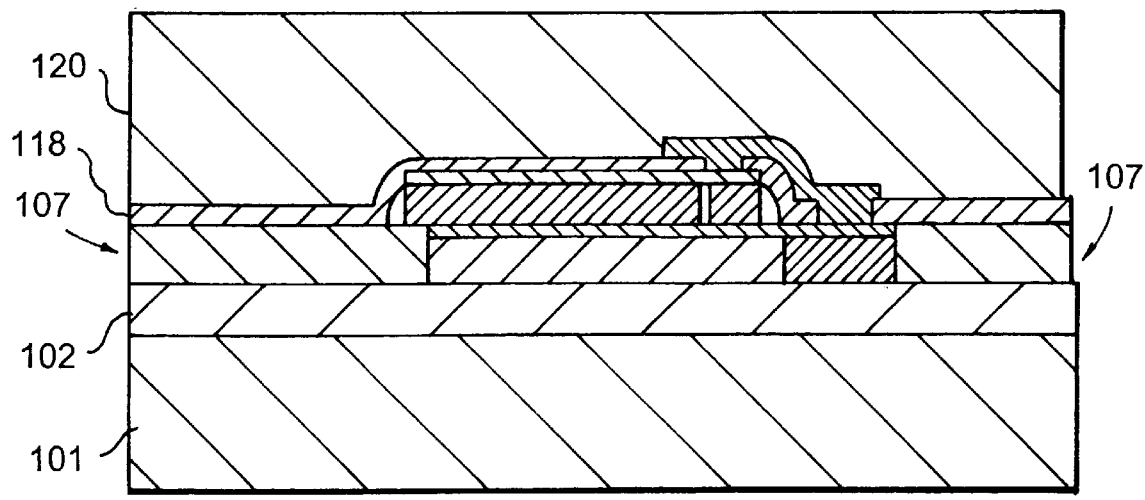
Figure 5:
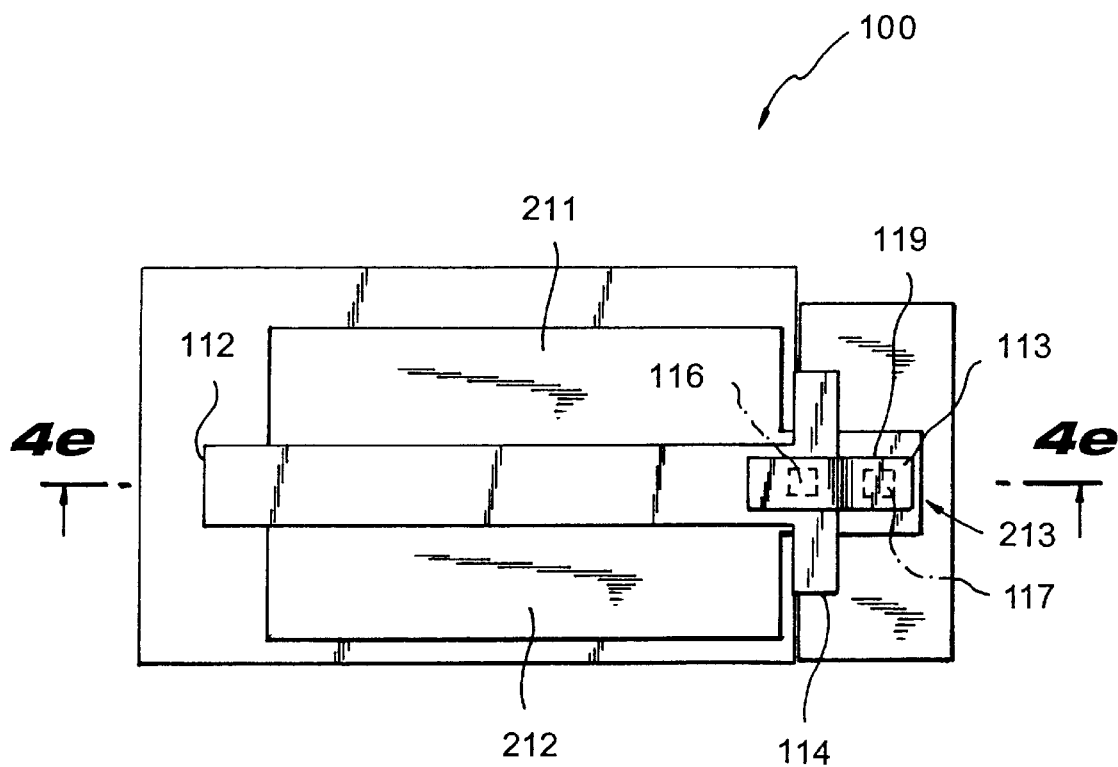
FIG. 5 is a top view of a transistor formed in steps of FIG. 4.

The top view of the transistor 30 having a resistor 70 connected between the gate 60 and the body 40 is shown in FIG. 5. FIGS. 4(a)–(f) show 6 stages of forming of that device along the cross section 500 (FIG. 5).

FIG. 4(a) shows a ~20 nm silicon dioxide layer 104 formed on top of the silicon-on-insulator wafer comprising a substrate silicon layer 101, a bottom silicon dioxide layer 102 and a top silicon layer 103. A ~40 nm silicon nitride layer 105 is then formed on top of the layer 104. Two isolation regions 107 (FIG. 4(b)) are then patterned by forming a photo resist layer 106 and etching the silicon nitride layer 105, the silicon dioxide layer 104, and the top silicon layer 103, ultimately stopping at the bottom silicon dioxide layer 102.

As shown in FIG. 4(b), the remaining photo resist 106 (FIG. 4(a)) is stripped, and trenches 107 are filled with silicon dioxide and planarized by etch-back and/or chemical-mechanical polish stopping at the pad silicon dioxide layer 104. The NFET body region 108 is formed between the two isolation regions 107. After being formed, region 108 is photo masked and doped P-type. A ~2.5 nm–7.0 nm gate oxide layer 109 is grown over the region 108 after the MOSFET threshold-voltage implants are formed and the pad silicon dioxide 104 is stripped.

FIG. 4(c) shows the intrinsic polysilicon layer 110 being formed over the trench 107 and the region 109. After a resist layer is deposited and patterned, the polysilicon 111 is etched stopping at the gate oxide of the trench 107 and the region 109. The spacer material, e.g., $Si_3N_4$, is deposited and directionally etched. The N+ implant source/drain mask is disposed and an n-type dopant, e.g., arsenic is implanted into the N-source/drain 211, 212 (FIG. 5) regions and the gate 112. The area which will become the body contact region 113 and the adjacent end of polysilicon gate 114 are blocked from the N-type implant and subsequently doped P+, using P+ source/drain mask 213 (FIG. 5) and dopant, e.g., boron.

As shown in FIG. 4(d), after the metal layer 115, such as titanium or cobalt, is deposited over the whole structure 100, it is annealed to form silicide in regions where metal physically contacts silicon or polysilicon. The remaining metal is selectively etched off above spacers 127 and oxide regions 107. Conformally, ~50 nm silicon nitride 118 is deposited over the entire structure 100. The contact regions 116 and 117 are photo masked and etched in silicon nitride.

Shown in FIG. 4(e), a ~20 nm lightly-doped ~100 k-ohm-cm N-type polysilicon 119 is deposited over the entire structure 100, patterned and etched to leave resistive stripe 119 between the gate and the body contacts regions 116 and 117. Finally, as shown in FIG. 4(f), a passivation layer 120, such as silicon dioxide or silicon nitride is deposited and planarized by chemical-mechanical polishing and/or etch-back. Additional conventional processing steps are performed to complete the exemplary embodiment of a N-type MOSFET pass-gate circuit 20 pursuant to the present invention as shown in FIG. 2. The method described above is disclosed only by way of example and not to limit the invention.

The value of the resistor 70 is approximately $10^{10}$ ohms-um divided by the width of the pass-gate. At this value of resistance, the body 40 will always discharge to the low state, e.g., 0 volts, before significant thermal charging can occur when the gate 60 is low, and thus prevent accumulation or build up of the body charge when the pass-gate is off. The value of the resistor 70 is high enough so that the current from the gate 60 to the body 40, when the gate is high, e.g., 1.8 volts, and the source 11 and drain 12 are low, e.g., 0 volts, is negligible, e.g.,~0.2 nA/um compared to the MOSFET's ~2 nA/um subthreshold current. This circuit significantly lessens the increase in the standby current in SOI MOSFETS. This lower increase is due to the low gate 60 potential which grounds the body 40 and keeps the threshold voltage (Vt) from dropping due to drain 12 avalanche multiplication of the current charging the body 40, because any such drain 12 to body 40 leakage will be dissipated by the gate 60 to body 40 resistor 70.

The described embodiment is an N-type MOSFET 30. However, the present invention also encompasses P-type MOSFETs, wherein the circuits would reflect reverse embodiments thereof.

While a preferred embodiment and variations of the present invention for an SOI pass-gate disturb solution are described in detail herein, it should be apparent that the disclosure and teachings of the present invention will suggest many alternative designs to those skilled in the art.

Having thus described our invention, what we claim as new, and desire to secure by Letter Patent is:

1. In a field effect transistor fabricated in a substrate and having a source, a drain and a gate, wherein the body of the field effect transistor is electrically floating and the transistor is substantially electrically isolated from the substrate, the improvement comprising a high resistance path coupling the electrically floating body of the field effect transistor to the gate of the field effect transistor, such that the body discharges to a low state before a significant thermal charging can occur when the gate is low, and thus prevents an accumulation of a charge on the body when the transistor is off.

2. The field effect transistor of claim 1, wherein the resistance of the high resistance path is approximately $10^{10}$ Ohms-um divided by the width of the pass-gate.

3. The field effect transistor of claim 1, wherein the value of the high resistance path is sufficiently high that current from the gate to the body, when the gate is high and the source and drain are low, is negligible compared to the subthreshold current.

4. The field effect transistor of claim 1, wherein the transistor is fabricated in SOI MOSFET.

5. The field effect transistor of claim 4, wherein the circuit significantly lessens an increase in standby current in the SOI MOSFET since the low gate potential grounds the body and prevents the threshold voltage (Vt) from dropping due to drain avalanche multiplication of the current charging the body.

* * * * *